(12) United States Patent
Ahmed et al.

(10) Patent No.: US 6,472,233 B1
(45) Date of Patent: Oct. 29, 2002

(54) MOSFET TEST STRUCTURE FOR CAPACITANCE-VOLTAGE MEASUREMENTS

(75) Inventors: Khaled Z. Ahmed, Newport Beach; Nguyen D. Bui, San Jose; Effiong Ibok, Sunnyvale, all of CA (US); John R. Hauser, Raleigh, NC (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/586,960

(22) Filed: Jun. 5, 2000

Related U.S. Application Data
(60) Provisional application No. 60/147,039, filed on Aug. 2, 1999.

(51) Int. Cl.$^7$ .......................... G01R 31/26; H01L 21/66
(52) U.S. Cl. ........................... 438/14; 438/14; 438/18; 438/197; 324/769; 324/500; 257/288
(58) Field of Search ................... 438/14, 18, 197; 257/288; 324/769, 500

(56) References Cited

U.S. PATENT DOCUMENTS

| | | | | |
|---|---|---|---|---|
| 3,882,391 A | * | 5/1975 | Liles et al. | 324/158 |
| 5,600,578 A | * | 2/1997 | Fang et al. | 364/578 |
| 5,793,675 A | * | 8/1998 | Cappelletti et al. | 365/185.09 |
| 5,821,766 A | * | 10/1998 | Kim et al. | 324/769 |
| 6,049,104 A | * | 4/2000 | Hshieh et al. | 257/328 |
| 6,069,485 A | * | 5/2000 | Long et al. | 324/769 |
| 6,100,751 A | * | 8/2000 | De et al. | 327/534 |
| 6,166,558 A | * | 12/2000 | Jiang et al. | 324/769 |
| 6,228,663 B1 | * | 5/2001 | Gardner et al. | 438/14 |

OTHER PUBLICATIONS

Ahmed et al. "Impact of tunnel currents and channel resistance on channel inversion layer and poly–gate depletion of Sub–20A oxide MOSFET's" IEEE Transactions on Electron devices vol. 46. No. 8 Aug. 1999.*

Brews et al. "A Test for lateral nonuniformities in MOS devices using only capacitance Curves" Solid–state Electronics vol. 16 1973 pp. 1267–1277.*

Lee et al. "A new rf capacitance method to extract the effective channel length of mosfets using s–parameters" IEEE 0–7803–6304–Mar. 2000 pp. 56–59.*

Yeap, et al., "Sub–100–nm nMOSFET's with direct tunneling termal, nitrous, and nitric oxides," Proc. 56$^{th}$ Annu. Dev. Res. Conf. (DRC), Charlottesville, VA 1998, pp. 10–11.

Timp et al., "Low leakage, ultra–thin gate oxides for extremely high performance sub–100–nm nMOSFET's," IEDM Tech. Dig., 1994, pp. 593–596.

Buchanan, et al., "Reliability and integration of ultra–thin gate dielectrics for advanced CMOS," Microelectron. Eng. vol. 36, 1997, pp. 13–20.

Chow, et al., "A new AC technique for accurate determination of channel charge and mobility in very thin Gate MOSFET's," IEEE Trans. Electron Devices, vol. ED–33, Sep. 1986, pp. 1299.

Lieneweg, "Frequency response of charge transfer in MOS inversion layers," Solid–State Electron, vol. 23, 1980, pp. 577–583.

(List continued on next page.)

*Primary Examiner*—Caridad Everhart
*Assistant Examiner*—Granvill D. Lee
(74) *Attorney, Agent, or Firm*—Foley & Lardner (57) ABSTRACT

An apparatus and method used in extracting polysilicon gate doping from C–V analysis in strong inversion, especially for ultrathin gate oxides. For sub-20-angstrom oxide MOS devices, transistors with channel lengths less than about 10 $\mu$m are connected in parallel to avoid an extrinsic capacitance roll-off in strong inversion. The upper limit of the channel length is estimated using a transmission-line-model of the terminal capacitance, which accounts for the non-negligible gate tunneling current and finite channel resistance.

12 Claims, 10 Drawing Sheets

OTHER PUBLICATIONS

Lee, "A Capacitance–Based Method for Experimental Determination of Mettalurgical Channel Length of Submicron LDD MOSFET's", IEEE Transactons on Electron Devices, vol. 41, No. 3, Mar. 1994, pp. 403–412.

E. Vogel et al., "Modeled Tunnel Currents for High Dielectric Constant Dielectrics", IEEE Transactions on Electron Devices, Vo. 45, No. 6, Jun., 1998, pp. 1350–1355.

T. Smedes et al., "Influence of Channel Series Resistances on Dynamic MOSFET Behavior",:1994, pp. 251–254.

C. Wang, "Identification and Measurement of Scaling–Dependent Parasitic Capacitances of Small–Geometry MOSFET's", IEEE Transactions on Electron Devices, vol. 43, No. 6, Jun. 1996, pp. 965–972.

A. Ernst et al., "A New Z11 Impedance Technique to Extract Mobility and Sheet Carrier Concentration in HFET's and MESFET's", IEEE Transactions on Electron Devices, vol. 45, No. 1, Jan. 1998, pp. 9–13.

B. Ricco et al., "Characterization of Polysilicon–Gate Depletion in MOS Structures", IEEE Electron Device Letters, vol. 17, No. 3, Mar., 1996, pp. 103–105.

W. Lin, "A Simple Method for Extracting Average Doping Concentration in the Polysilicon and Silicon Surface Layer Near the Oxide in Polysilicon–Gate MOS Structures", IEEE Electron Device Letters, vol. 15, No. 2, Feb. 1994, pp. 51–53.

H. Momose et al., Tunneling Gate Oxide Approach to Ultra–High Current Drive In Small–Geometry MOSFET's, IEDM Tech. Digest, 1997, pp. 94–593 —94–596.

\* cited by examiner

MOSFET TEST STRUCTURE FOR CAPACITANCE-VOLTAGE MEASUREMENTS

RELATED APPLICATIONS

This application is related to provisional application 60/147,039, filed Aug. 2, 1999, to which this application claims priority.

BACKGROUND OF THE INVENTION

1. Field of the Invention

The present invention relates to apparatus and a method related to a test structure for capacitance-voltage (C–V) measurements for very thin oxides.

2. Description of the Related Art

Oxides as thin as 13–15 angstroms have been used as gate dielectrics to fabricate sub-100-nm polysilicon-gated CMOS devices. See, for example, G. C.-F. Yeap et al., Sub-100-nm nMOSFET's with direct tunneling thermal, nitrous, and nitric oxides," in Proc. $56^{th}$ Annu. Dev. Res. Conf. (DRC), Charlottesville, Va. 1998, pp. 10–11; G. Timp et al., "Low leakage, ultra-thin gate oxides for extremely high performance sub-100-nm nMOSFET's ," in IEDM Tech. Dig., 1994, pp. 593–596; D. A. Buchanan and S.-H. Lo, "Reliability and integration of ultra-thin gate dielectrics for advanced CMOS," in Microelectron. Eng., vol. 36, pp. 13–20, 1997; and J. Hauser and K. Ahmed, "Characterization of ultrathin oxides using electrical C–V and I–V measurements," in National Institutes of Standards and Technology, Gaithersburg, Md., Mar. 23–27, 1998. Characterization of sub-0.1 $\mu$m CMOS devices requires accurate determination of the device material and physical parameters, such as oxide thickness $t_{ox}$, oxide charges $Q_f$, surface doping in the substrate ($N_{sub}$) and polysilicon-gate doping ($N_{poly}$) densities, and interface state density. Although high frequency (HF) C–V, measured on MOS capacitor structures, can be used for estimating $t_{ox}$, $Q_f$ and $N_{sub}$, it is necessary to use MOSFET structures to obtain the low-frequency-like (LF) C–V curve in strong inversion to estimate $N_{poly}$, especially for sub-30 Å oxides. With a MOSFET, the inversion layer charge is maintained by the minority carriers supplied by the source and drain junctions. To avoid distortion of the C–V curve due to channel charging effects, it is necessary to use MOSFET structures with proper channel length L, and measurement frequency f, in order to satisfy the condition: $2\pi f \times \tau_{gc} \ll 1$, where, $\tau_{gc}$ ($L^2 \cdot t_{ox})^{-1}$ is the channel time constant. See P.-M. D. Chow and K.-L. Wang, "A new AC technique for accurate determination of channel charge and mobility in very thin gate MOSFET's ," in IEEE Trans. Electron Devices, vol. ED-33, pp. 1299, September 1986; U. Lieneweg, "Frequency response of charge transfer in MOS inversion layers," in Solid-State Electron., vol. 23, pp. 577–583, 1980. This condition sets an upper limit on L for a given frequency f. In addition, accuracy requirements imposes a lower limit on L, in order to minimize gate overlap capacitance parasitic effects, and a lower limit exists on the measurement frequency for any capacitance meter to accurately separate capacitive and conductive components of the measured impedance, especially for sub-20 Å devices.

Anomalous dependence on C–V characteristics on test structure geometry for sub-15 Å oxides have been reported. See Bayomi et al., "Process, characterization and integrity issues for 15 Å gate oxides," in Proc. 1998 Hewlett-Packard Silicon Technology Conf., Portland, Oreg., Mar. 31–Apr. 3, 1998, pp. 33–38. It was reported that the capacitance measured on large area capacitor or transistor structures show large attenuation in both strong inversion and accumulation bias regimes. The capacitance attenuation was found to increase with increasing the gate area in both bias regimes. A model with distributed gate sheet resistance and bias-dependent tunneling conductance was proposed and used to explain the observed experimental data. However, although the polysilicon gate sheet-resistance may be important in accumulation, the present inventors have determined that the channel resistance will be dominant in strong inversion, especially for MOSFETs with silicided polysilicon gates. This can be seen from the dependence of the strong inversion capacitance roll-off on the channel length, as will be explained in more detail below.

SUMMARY OF THE INVENTION

The invention provides a method and apparatus for test structures for capacitance-voltage measurements for very thin oxides.

A test structure may include a first MOSFET having a channel length less than a predetermined channel length, and a second MOSFET having a channel length less than the predetermined channel length. The first and second MOSFETS are connected in parallel. Device parameters are capable of being extracted from the MOSFET test structure. Effects due to tunneling currents and channel dimensions are considered in determining a terminal capacitance of the MOSFET test structure.

A MOSFET test structure method includes modeling a first MOSFET having a channel length less than a predetermined channel length; and modeling a second MOSFET having a channel length less than the predetermined channel length. The method also includes connecting the first and second MOSFETS in parallel. At least one device parameter is capable of being extracted utilizing the MOSFET test structure.

BRIEF DESCRIPTION OF THE DRAWINGS

The invention will become more fully apparent from the following detailed description when read in conjunction with the accompanying drawings with like reference numerals indicating corresponding parts throughout, and wherein.

DETAILED DESCRIPTION OF THE PREFERRED EMBODIMENT

A preferred embodiment of the present invention will be described in detail hereinbelow, with reference to the drawings.

In the present invention, a distributed model similar to that used by Bayoumi et al. is used to explain the capacitance roll-off in strong inversion and its dependence on the channel length for sub-20-Å oxides.

A relatively simple analytical model for the terminal gate-to-channel capacitance, taking the effects of gate tunneling current and channel resistance into account, has been derived by the inventors of this application to calculate the upper limit on test structure channel length for a given oxide thickness and measurement frequency. Using this model, it was found that the upper limit of the channel length becomes smaller for MOSFETs with gate oxides thinner than about 20 Å, due to high tunneling currents. Using MOSFETs with channel lengths beyond this limit may lead to significant errors in the estimated polysilicon gate doping concentration.

The devices tested by the inventors were fabricated using standard dual-gate 0.25 μm CMOS technology. The polysilicon gate for all samples was doped using the same dose and energy and was exposed to the same anneal cycle, resulting in an average polygate doping density of approximately $10^{20}$ cm$^{-3}$ as determined from C-V measurements. All C-V measurements were made using an HP4284 LCR meter with the setup configuration shown by N. Arora, "MOSFET Models for VLSI Circuit Simulation: Theory and Practice," New York: Springer-Verlag, 1993, pp. 456. The capacitance measurement error due to conductance was less than 1% at a gate bias of ±1.5 V and the thinnest gate oxide of ~14 Å.

Figure 1A:
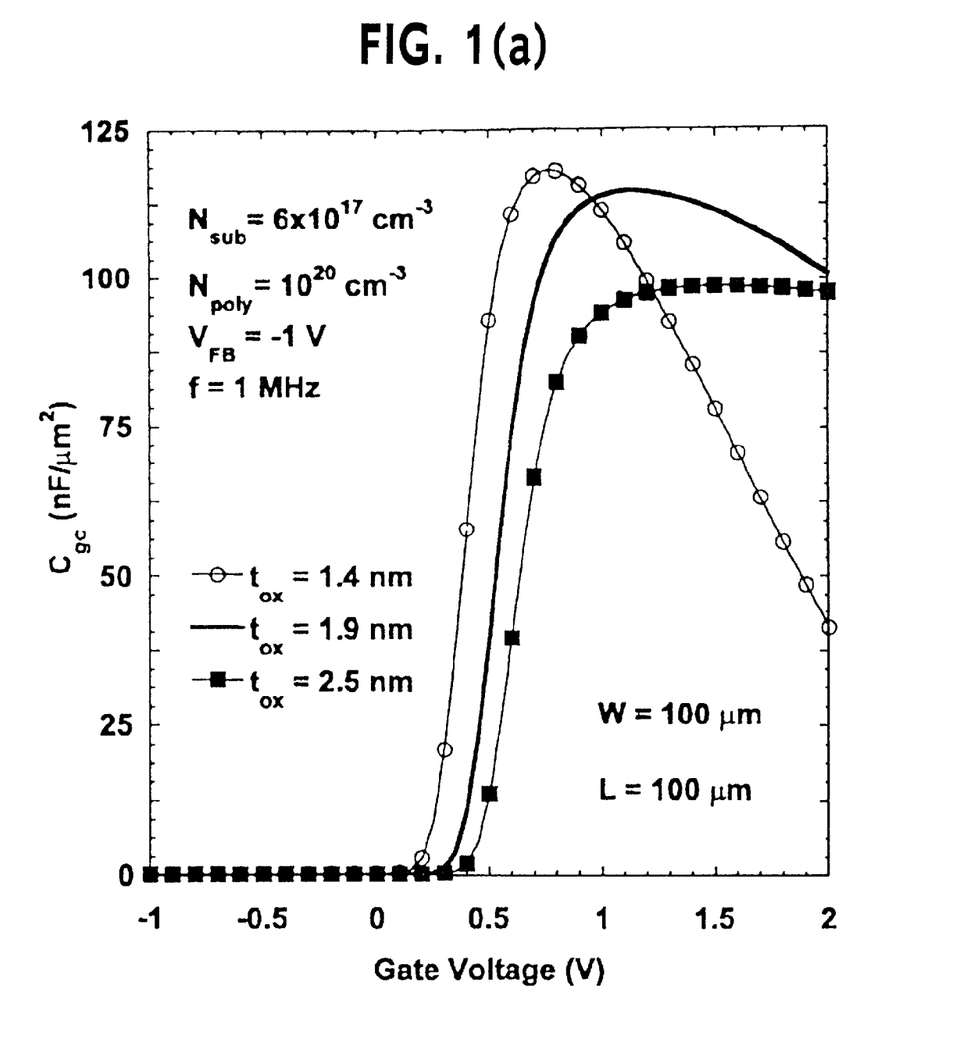
FIG. 1a shows a plot of measured gate-to-channel capacitance versus gate bias for an nMOSFET with different gate oxide thickness and a long channel length of 100 microns.
Figure 1B:
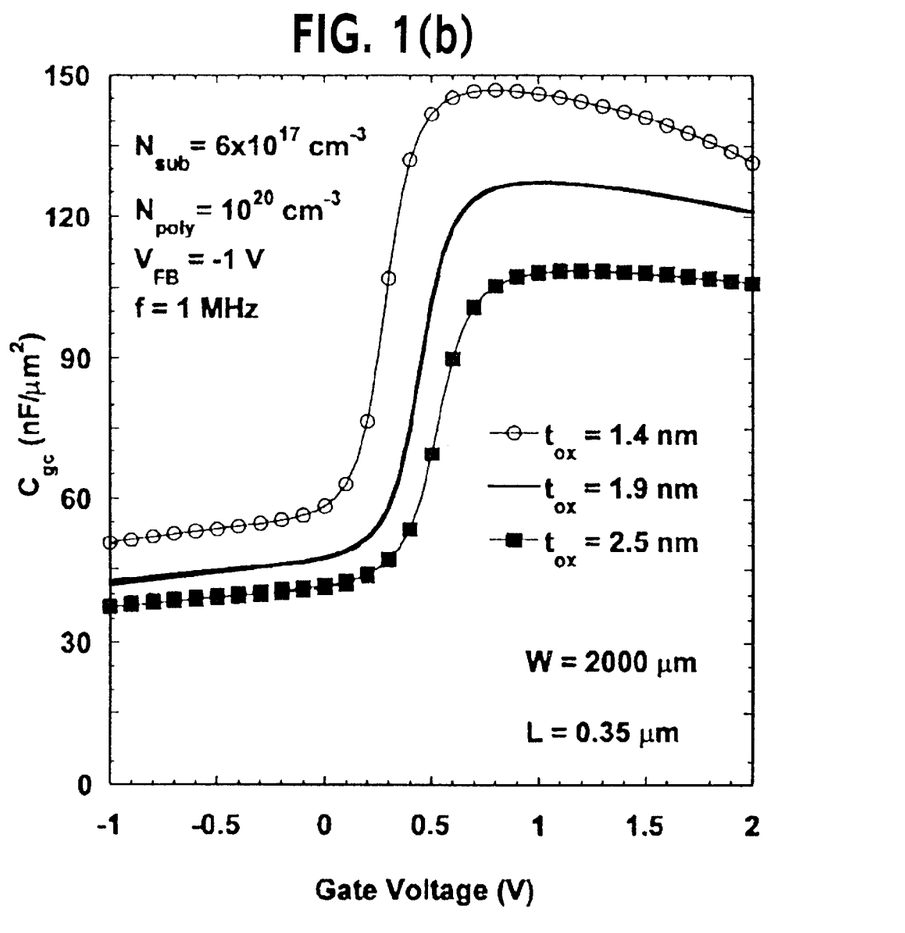
FIG. 1b shows a plot of measured gate-to-channel capacitance versus gate bias for an nMOSFET with different gate oxide thickness and a short channel length of 35 microns.

In FIGS. 1a and 1b, the split-capacitance characteristics, $C_{gc}$-$V_g$, measured on n-MOSFETs with different oxide thickness of 14, 19 and 25 Å, and gate dimensions of W×L=100 μm×100 μm and 2000 μm×0.35 μm, are shown. For relatively thick oxide devices ($t_{ox} \gtrsim$ ~20 Å), the capacitance roll-off (or decrease) in inversion can be solely explained by the polysilicon depletion effect for any channel length (L≦100 μm). However, for sub-20 Å oxide devices one observes a faster capacitance roll-off under strong inversion as the channel length is increased from ~0.35 μm to 100 μm. This behavior was found to be repeatable and independent of the procedure used to grow the gate oxide. The estimated measurement error can explain neither the observed magnitude of capacitance degradation nor the dependence on channel length for a given oxide thickness.

The observed capacitance behavior can be explained using a transmission-line model of the terminal $C_{gc}$ along with synthetic intrinsic $C_{gco}$-$V_g$ and $I_g$-$V_g$ data generated by a one-dimensional (1-D) numerical simulation.

Figure 2:
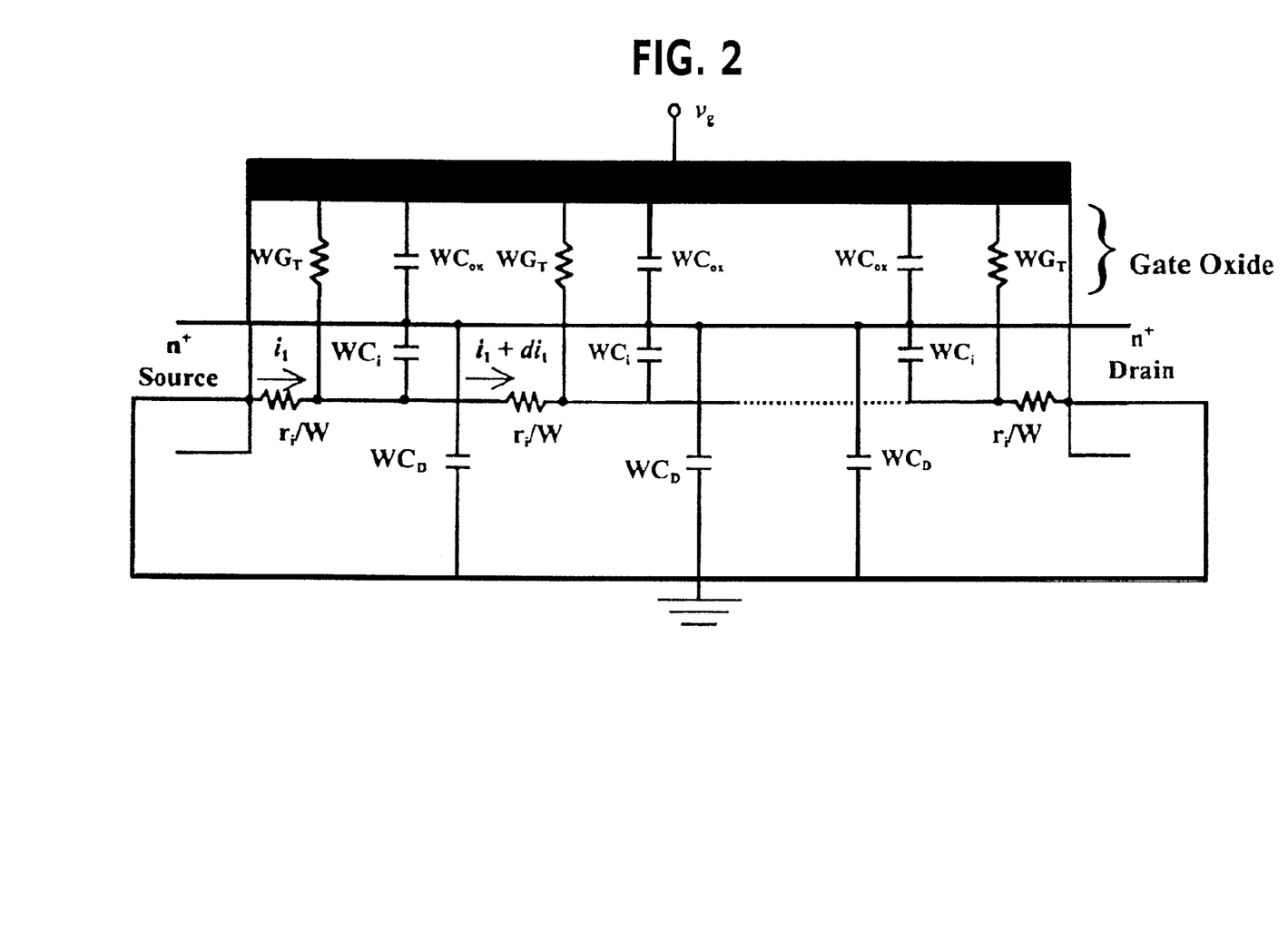
FIG. 2 shows a transmission line equivalent circuit that is used to model a MOSFET in accordance with the present invention.

The inversion channel of the long-channel MOSFET can be modeled by a transmission-line network as shown in FIG. 2. The resistance, $r_i$, and capacitance $C_i$ account for the finite inversion layer resistance and capacitance, respectively. Tunneling of carriers from the inversion layer through the gate oxide is represented by a simple conductance $G_T$, which can be approximated by the DC conductance, $$G_T = \frac{\partial I_g}{\partial V_g}.$$

If the source, drain and substrate are tied to ground, the inversion charge $Q_i$, $r_i$, $G_T$, $C_i$, and $C_D$ may be assumed approximately constant along the channel if the gate leakage current is not too large. Using the approximations $C_{D<<}C_i$ and $C_{D<<}C_{ox}$, an analytical expression of the terminal gate-to-channel capacitance can be derived in terms of intrinsic components:

$$C_{gc} \approx \frac{G_T}{\omega}\text{Im}\left[\frac{\tan\lambda}{\lambda}\right] + C_{gco}\text{Re}\left[\frac{\tan\lambda}{\lambda}\right] \quad (1.\text{a})$$

$$C_{gco} \approx \frac{C_i C_{ox}}{C_i + C_{ox}} \equiv \frac{\partial Q_i}{\partial V_g} \quad (1.\text{b})$$

$$\lambda = \frac{L}{2}\sqrt{G_T r_i + j\omega C_{gco} r_i} \quad (1.\text{c})$$

$$r_i = \frac{1}{Q_i \mu_n} \quad (1.\text{d})$$

where
 ω is the angular frequency,
 $Q_i$ is the inversion layer charge density (C/cm$^2$),
 L is the channel length, and
 $\mu_n$ is the field-dependent effective electron mobility.
The fact that $$\text{Im}\left[\frac{\tan\lambda}{\lambda}\right] < 0$$

and $$0 < \text{Re}\left[\frac{\tan\lambda}{\lambda}\right] \leq 1$$

means that $C_{gc} \leq C_{gco}$ for any values of L, $G_T$ or ω. Larger channel lengths result in larger λ, smaller, $$\text{Re}\left[\frac{\tan\lambda}{\lambda}\right],$$

more negative values for, $$\text{Im}\left[\frac{\tan\lambda}{\lambda}\right],$$

and therefore more capacitance degradation.

The terminal $C_{gc}$-$V_g$ curve can be calculated using Equation (1) by generating $C_{gco}$-$V_g$ and $J_g$-$V_g$ curves using 1-D numerical simulation, taking both QM and Polydepletion effects into account. The model solves the Schrodinger-Poisson system of equations to find the inversion charge density, $Q_i$, and the surface potential, $\phi_s$, or different values of the gate bias. Once $Q_i$ is found as a unction of $V_g$, the inversion layer capacitance, $C_i$, is then be calculated using the definition $$C_i = \frac{\partial Q_i}{\partial \varphi_s},$$

and the quasi-static gate-to-channel capacitance, $C_{gco}$, and the channel resistance $r_i$ are calculated as a function of $V_g$ using Equations (1.b) and (1.d), respectively.

Figure 3:
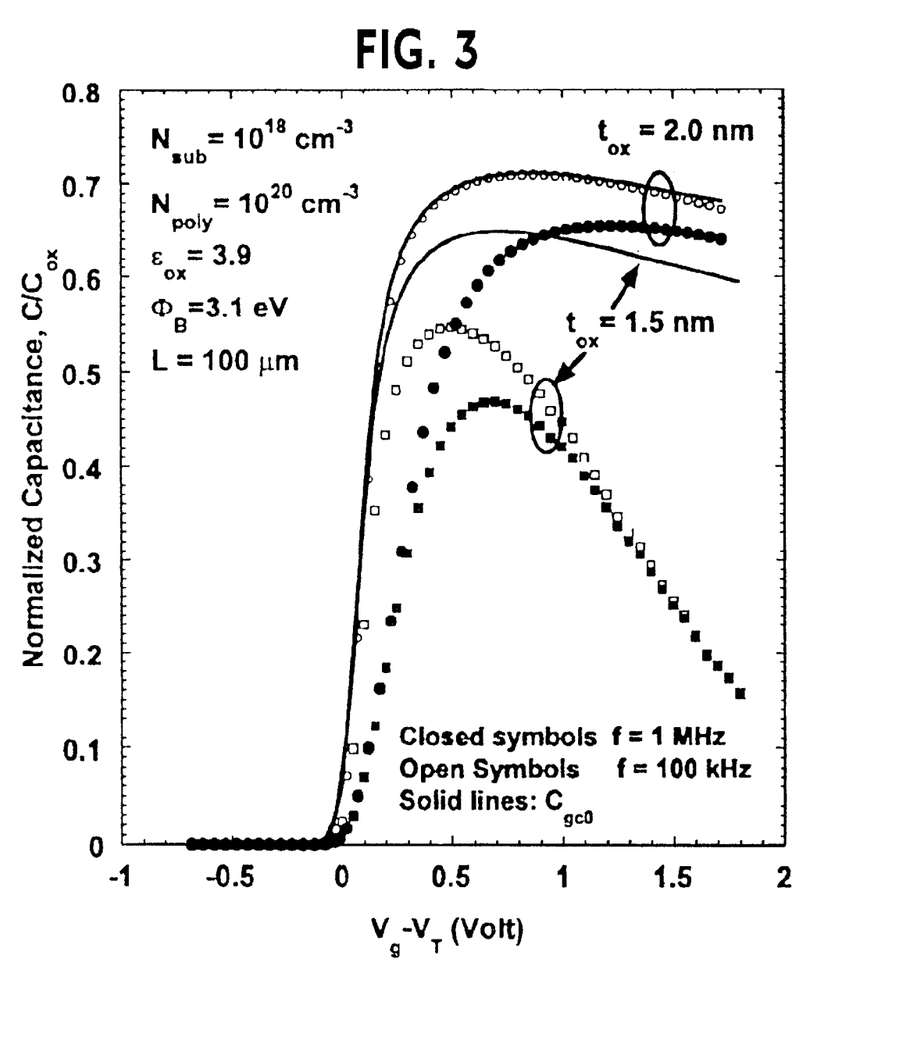
FIG. 3 is a plot of simulated Cgc–Vg characteristics of 100 micron channel length nMOSFETs with gate oxide thicknesses of 1.5 and 2.0 nm.
Figure 4:
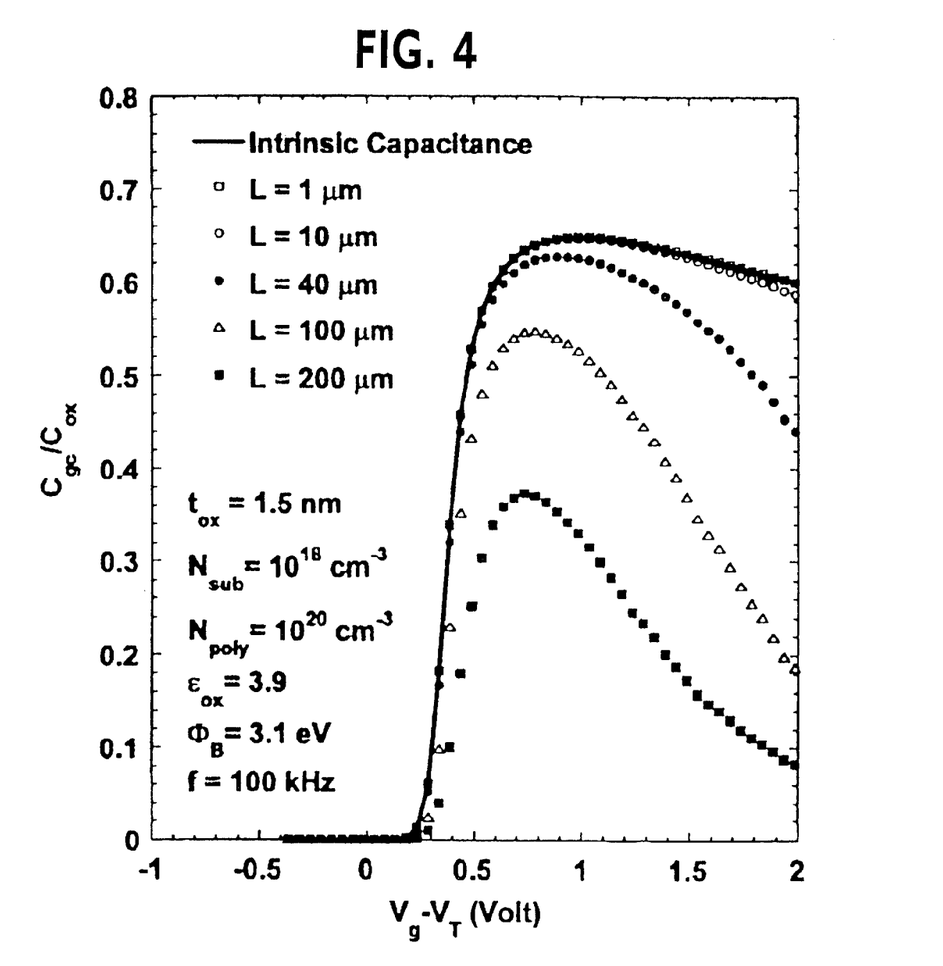
FIG. 4 is a plot of simulated gate-to-channel capacitance for nMOSFET with an oxide thickness of 1.5 nm with the channel length as the parameter.
Figure 5:
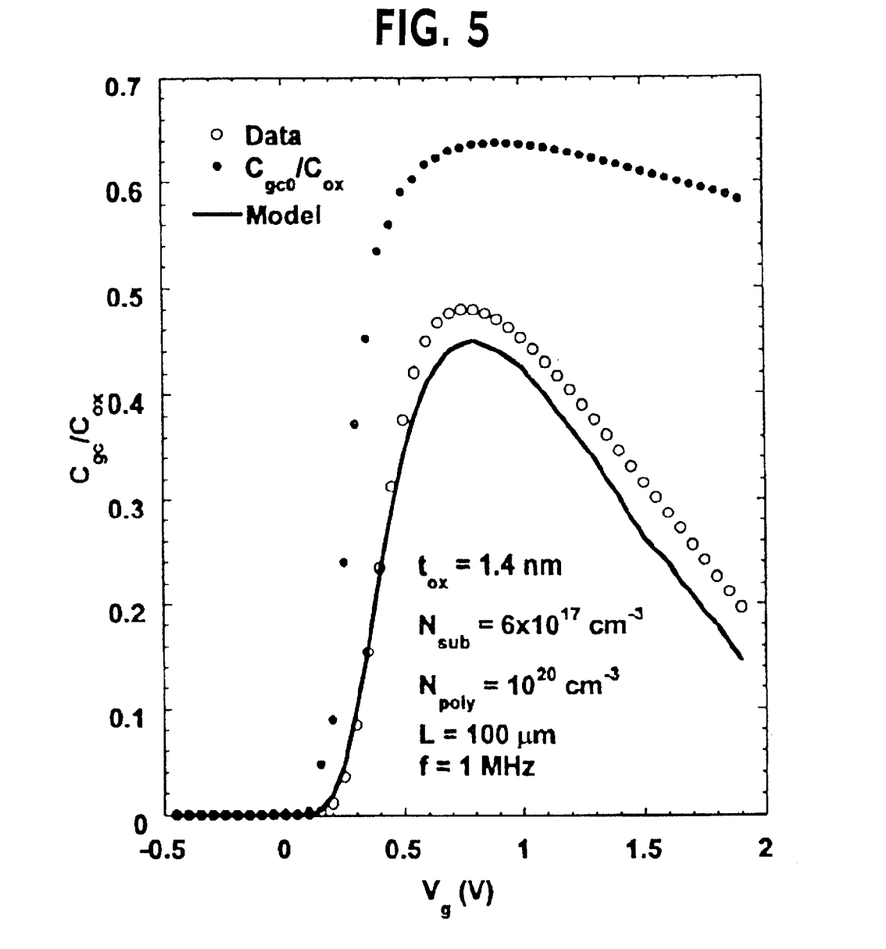
FIG. 5 is a plot of measured and simulated gate-to-channel capacitance for oxide thickness of 14 angstroms, channel length of 100 microns, polysilicon-gate doping density of $10_{20}$ cm$^{-3}$, and surface doping in the substrate of $5\times10^{17}$ cm$^{-3}$, where intrinsic $C_{gco}$–$V_g$ and $I_g$–$V_g$ curves created by numerical simulations were used to generate the theoretical curves.

A uniform substrate doping of $10^{18}$ cm$^{-3}$ and polysilicon gate doping of $10^{20}$ cm$^{-3}$ for three oxide thicknesses of 14, 15 and 20 Å were used to generate theoretical $C_{gco}$-$V_g$ and $I_g$-$V_g$ curves. The terminal gate-to-channel capacitance was then calculated using Equation (1) and the results are shown in FIGS. 3, 4 and 5. In FIG. 3, $C_{gc}$ as a function of $V_g$ is shown for devices with a channel length of 100 μm, and gate oxide thickness of 15 and 20 Å. The calculated terminal capacitance roll-off is consistent with the experimental data for long channel length MOSFETs (see FIG. 1a). In particular, for devices with gate oxide $\geq$20 Å, the effect of the gate tunneling current is relatively negligible, and the fall-off of the capacitance in strong inversion is solely due to the polydepletion effect. However, for devices with gate oxide of 15 Å, the non-negligible effects of gate tunneling current and finite channel resistance result in an excess capacitance roll-off, leading to significant errors in extracted polysilicon gate doping using simple models. It is also observed that the use of a higher frequency of 1 MHz to improve measurement accuracy may lead to the conventional capacitance distortion, shown as a shift of the capacitance in weak inversion as previously discussed.

The calculated terminal capacitance for a device with $t_{ox}$=15 Å with different channel lengths of 1, 10, 40, 100, and 200 μm is shown in FIG. 4. As the channel length decreases from 200 μm to below 10 μm, the effect of the channel resistance becomes less significant, and the fall-off of the capacitance in strong inversion can be used to extract the polysilicon gate doping density. Again, this result is consistent with the experimental data shown in FIGS. 1a and 1b.

In FIG. 5, simulated and measured $C_{gc}$-$V_g$ curves are shown for $t_{ox}$=14 Å, L=100 μm, $N_{poly}$=10$^{20}$ cm$^{-3}$, and $N_{sub}$=6×10$^{17}$ cm$^{-3}$. It is clear that that model predicts the capacitance degradation in strong inversion with a good accuracy. The small difference between model and data is most likely due to uncertainties in the tunneling barrier parameters (oxide thickness, barrier height, and electron effective mass in the oxide) used to calculate the tunneling current density that is used to calculate the tunneling conductance, $Q_T$.

Figure 6:
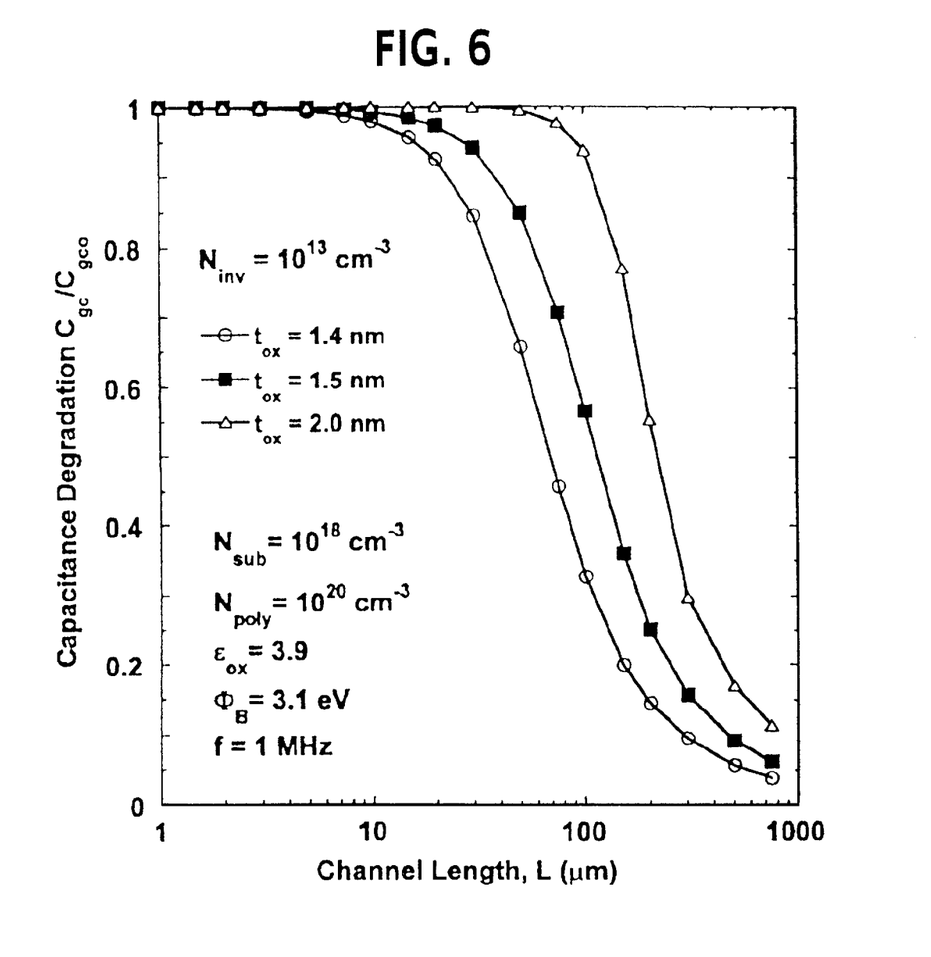
FIG. 6 shows a plot of simulated inversion capacitance degradation versus channel length for a fixed inversion carrier density of $10^{13}$ cm$^{-2}$, in which devices with channel lengths less than about 10 microns are needed to measure the intrinsic capacitance when the oxide thickness is less than about 2.0 nm.

FIG. 6 shows the simulated capacitance degradation ($C_{gc}$/$C_{gco}$) as a function of the channel length at a given inversion charge density, frequency, and different gate oxide thickness. This plot can be used to determine the upper limit of the channel length of MOSFETs used to measure low-frequency C–V in inversion for polygate doping extraction. For a typical inversion carrier density of 10$^{13}$ cm$^{-2}$, negligible capacitance degradation will be obtained if MOSFETs with channel lengths less than about 10 μm and gate oxides less than about 20 Å are used. For thinner gate oxides, even smaller channel lengths must be used. However, if the channel length is too small, parasitic elements such as series resistances and gate overlap and coupling capacitances at the source and drain ends of the channel become important. For example, a non-zero gate-to-channel capacitance that is approximately equal to the gate overlap capacitance is measured in accumulation bias as shown in FIG. 1b. The intrinsic C–V curve can be approximately recovered by subtracting this value from the capacitance measured at each gate bias. However, ignoring the gate bias dependence of the gate overlap capacitance may affect the accuracy of the polysilicon gate doping concentration that is extracted from the slope of the C–V curve in strong inversion. The effects of parasitic resistances at the source and drain ends of the channel can be minimized by making C–V measurements at a reasonably low frequency ($\leq$1 MHz) and/or using transistors with L$\geq$1 μm. For a given channel length the appropriate measurement frequency can be chosen from the flat portion of the capacitance versus frequency curve measured at a given gate bias in strong inversion.

The impact of tunneling currents and channel resistance on the measured gate-to-channel capacitance using long-channel MOSFETs with sub-20 Å gate oxide has been shown both experimentally and theoretically by the inventors. A simple model has been derived for the terminal capacitance in terms of the intrinsic capacitances, the tunneling conductance, the channel length and the measurement frequency. The model has been used to explain a measured extrinsic capacitance fall-off in strong inversion and its dependence on the oxide thickness and channel length of the test structure. For accurate characterization of both the inversion charge and the polysilicon gate depletion effect, MOSFET test structures with channel lengths less than about 10 μm should be used if the oxide thickness is less than about 20 Å.

The present invention provides a relatively-simple physics-based analytical model of the terminal capacitance that would be measured on large MOSFET structures. The analytical model, which can be run on a personal computer or the like, includes the effects of tunneling currents and channel dimensions (e.g., channel length). Based on the analytical model according to the invention, conventional large-area MOSFET structures cannot be used for normal C–V measurements when the gate oxide thickness of these MOSFETs is thinner than 20 angstroms.

The analytical model also can be used to explain the capacitance roll-off in strong accumulation on MOSFET test structures that use surface substrate contact. The separation between the surface substrate contacts should be less than 10 micrometers for oxides thinner than 20 angstroms, according to results obtained from the analytical model of the present invention.

Figure 7:
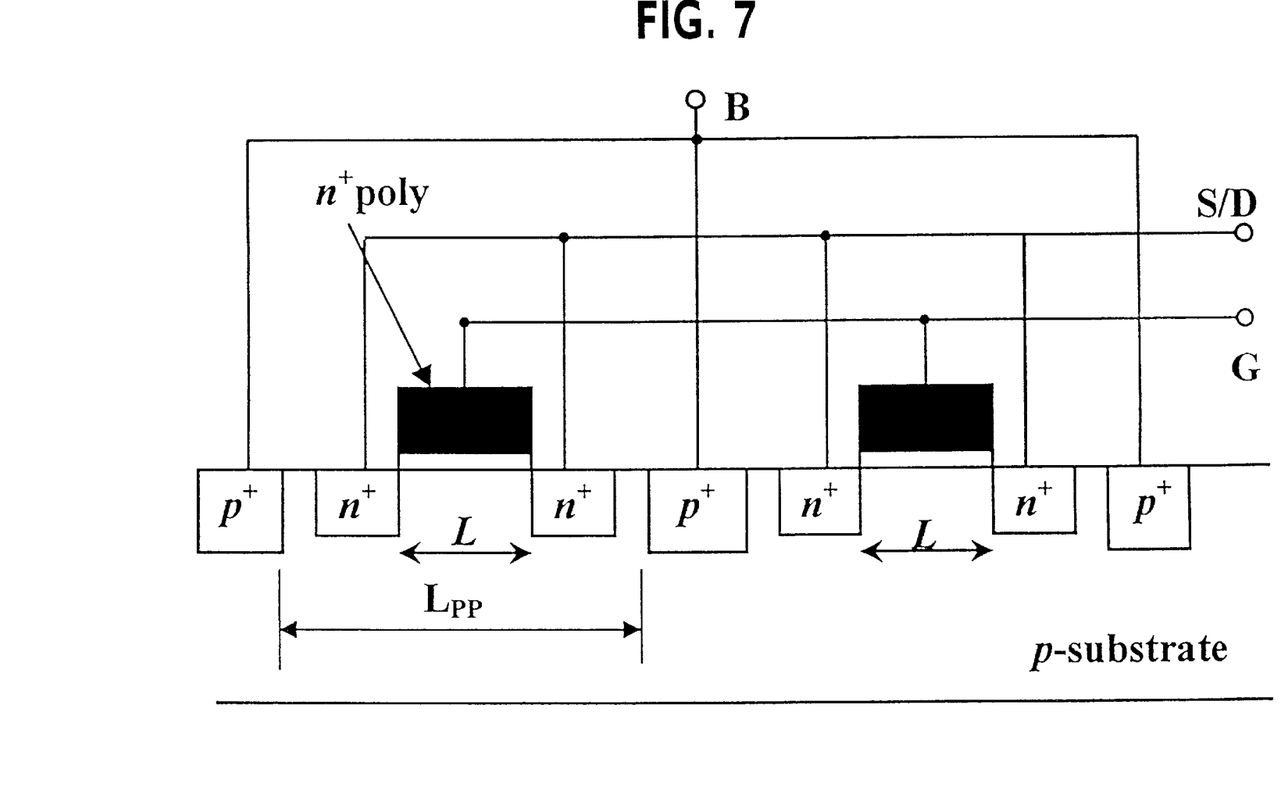
FIG. 7 is a schematic diagram of one possible configuration of a MOSFET test structure according to the invention.
Figure 8:
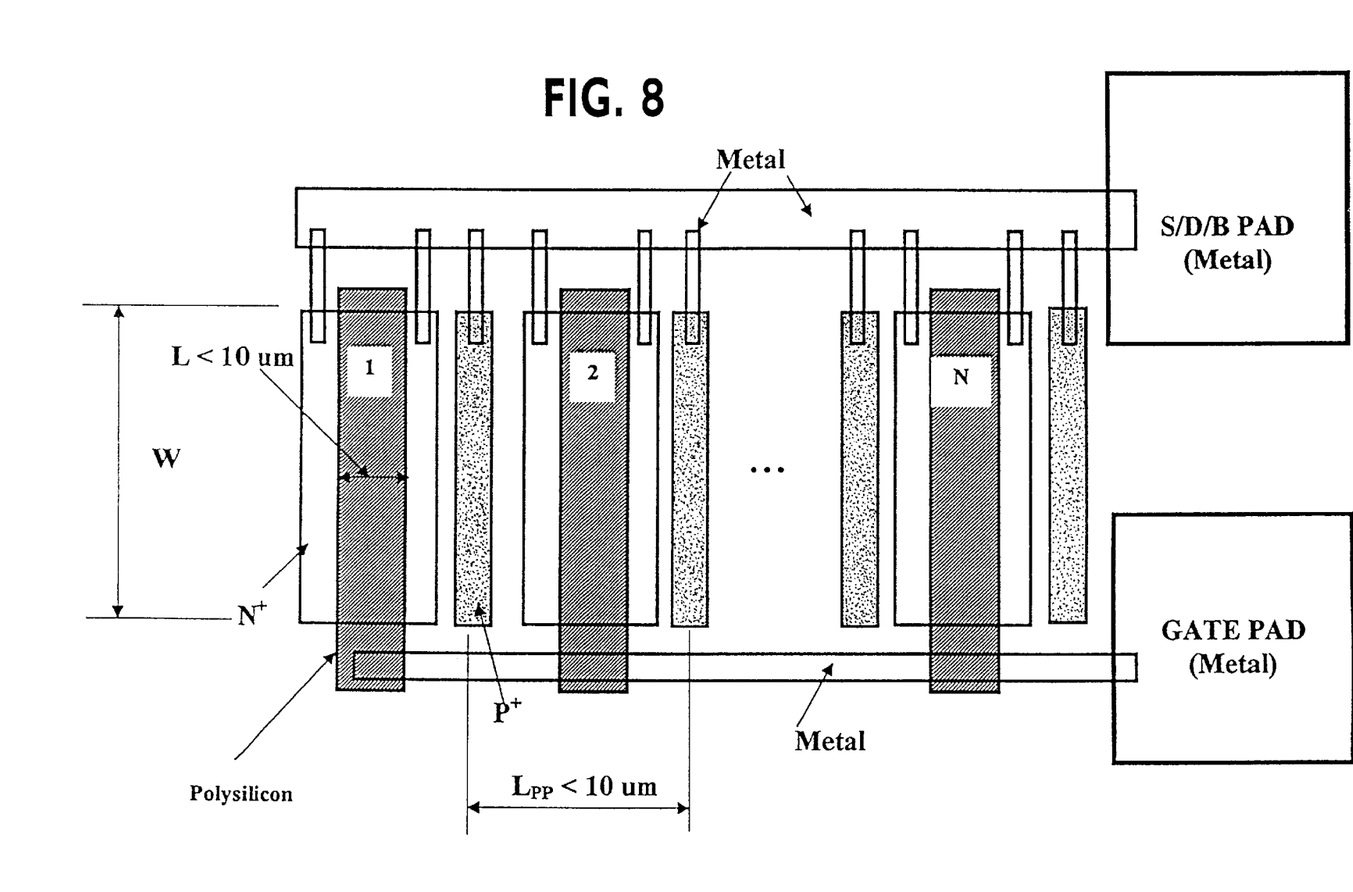
FIG. 8 is a schematic diagram of the layout of the configuration shown in FIG. 7.
Figure 9:
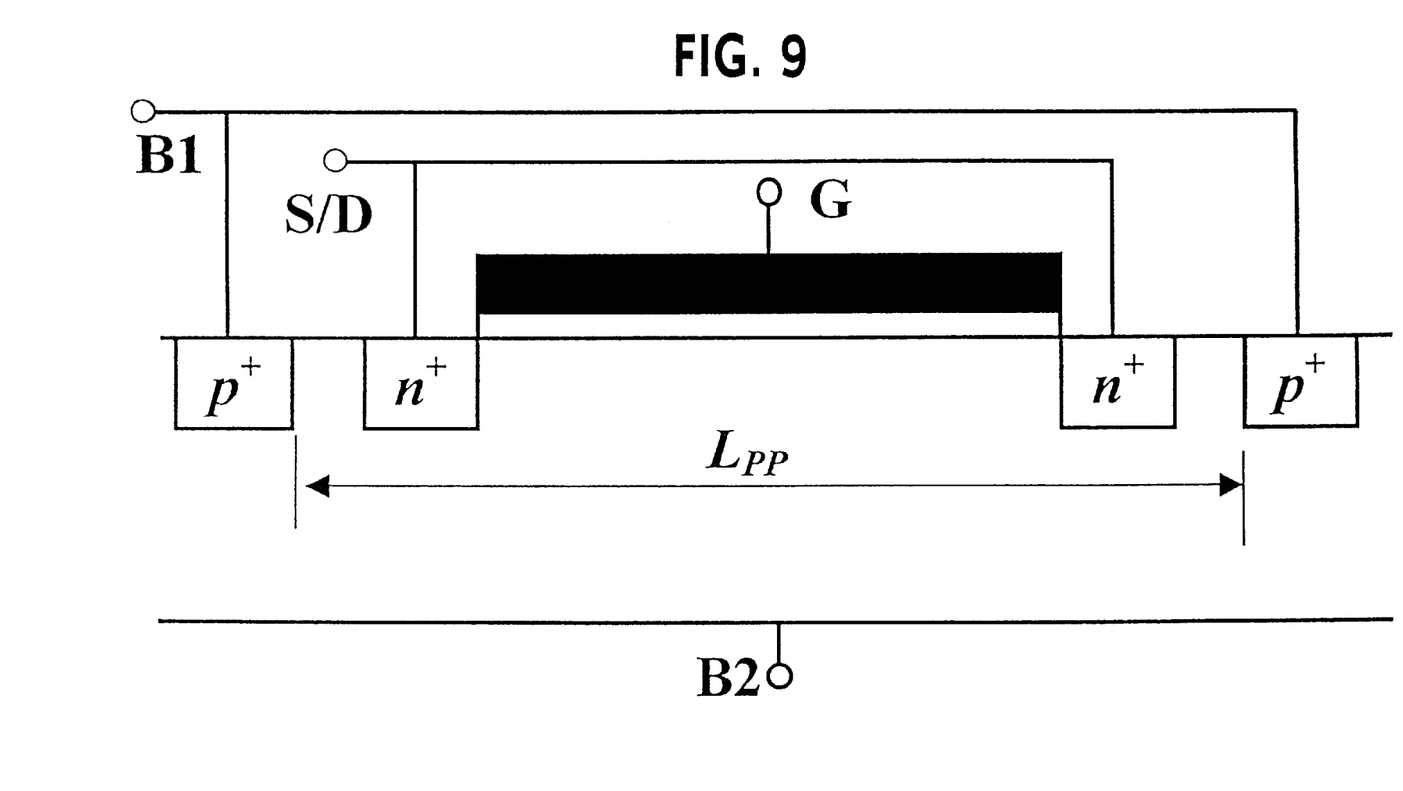
FIG. 9 is a schematic diagram of a conventional MOSFET test structure.

Based on that analytical model, a MOSET test structure according to the present invention is shown in FIG. 7 and FIG. 8, while a conventional MOSFET test structure used in C–V measurements is shown in FIG. 9. In this conventional test structure, Lpp is usually larger than or equal to 100 micrometers. This large channel length leads to unwanted large capacitance attenuation in both strong inversion and strong accumulation. This makes it difficult to extract reliable device parameters using the conventional C–V analysis model.

FIGS. 7 and 8 show a test structure constructed in accordance with the present invention. Unlike the conventional test structure, the test structure of FIGS. 7 and 8 avoids capacitance attenuation in both strong inversion and strong accumulation. The test structure according to the invention includes a set (two are shown in the view into the substrate of FIG. 7, while N are shown in the layout view of FIG. 8) of small channel length MOSFETs, each with channel lengths of 10 microns or less. Each of the small channel length MOSFETS are connected in parallel, as shown in FIG. 7, in order to increase the total area of the device structure. That is, the source/drain regions of each MOSFET are connected together, the gate regions of each MOSFET are connected together, and the base regions of each MOSFET are connected together.

While a preferred embodiment has been described herein, modification of the described embodiment may become apparent to those of ordinary skill in the art, following the teachings of the invention, without departing from the spirit and scope of the invention as set forth in the appended claims.

What is claimed is:

1. A MOSFET test structure, consisting of:
   a first MOSFET having a channel length less than 10 micrometers;
   a second MOSFET having a channel length less than 10 micrometers,
   wherein the first and second MOSFETS are connected in parallel, and
   wherein capacitance/voltage characteristics are capable of being measured from the MOSFET test structure by using a transmission line model of the first and second MOSFETs that accounts for tunneling currents and channel size.

2. The MOSFET test structure according to claim 1, wherein effects due to tunneling currents and channel dimensions are considered in determining the capacitance/voltage characteristics.

3. The MOSFET test structure according to claim 1, wherein an oxide thickness is less than or equal to 20 angstroms.

4. The MOSFET test structure according to claim 1, wherein source/drain regions of the first and second MOSFETs are connected together, and
   wherein gate regions of the first and second MOSFETs are connected together.

5. A MOSFET test structure method, comprising:
   modeling a first MOSFET having a channel length less than 10 micrometers by utilizing a transmission line model of the first MOSFET transistor that accounts for tunneling currents and channel size;
   modeling a second MOSFET having a channel length less than 10 micrometers by utilizing a transmission line model of the second MOSFET transistor that accounts for tunneling currents and channel size, and
   connecting the first and second MOSFETS in parallel,
   wherein at least one device parameter of a thin-oxide-MOSFET is capable of being extracted utilizing the MOSFET test structure.

6. The MOSFET test structure method according to claim 5, wherein an oxide thickness is less than or equal to 20 angstroms.

7. The MOSFET test structure method according to claim 5, wherein source/drain regions of the first and second MOSFETs are modeled as being connected together, and
   wherein gate regions of the first and second MOSFETs are modeled as being connected together.

8. A method for determining a doping amount for one or more polysilicon gates in a semiconductor device, comprising:
   providing a test circuit having two or more transistors coupled in parallel, wherein a channel length of each transistor is less than or equal to a threshold channel length, the threshold channel length being equal to or less than 10 micrometers,
   determining capacitance/voltage characteristics of said test circuit; and
   determining a doping amount of a polysilicon gate based on said capacitance/voltage characteristics,
   wherein said step of determining said threshold channel length comprises simulating a model circuit, and
   wherein said step of simulating said model circuit utilizes a transmission line model of a MOSFET transistor that accounts for tunneling currents and channel size.

9. The method of claim 8, further comprising:
   for a given gate oxide thickness, determining said threshold channel length near which capacitance degradation occurs for a transistor in a strong inversion region.

10. The method of claim 9, wherein said given gate oxide thickness is about equal to or less than 20 Angstroms.

11. The method of claim 8, wherein said step of determining said doping amount comprises comparing said capacitance/voltage characteristics with model capacitance/voltage characteristics obtained from simulation.

12. The method of claim 11, wherein said comparing of said capacitance/voltage characteristics with said model capacitance/voltage characteristics comprises determining a rate of capacitance reduction as an amount of voltage is applied at an increasing level to said at least two transistors.

* * * * *